United States Patent
Crooks

(10) Patent No.: US 10,564,198 B2
(45) Date of Patent: Feb. 18, 2020

(54) SPECTRUM ANALYZER USING MULTIPLE INTERMEDIATE FREQUENCIES AND MULTIPLE CLOCK CONFIGURATIONS FOR RESIDUAL, SPURIOUS AND IMAGE SIGNAL REDUCTION

(71) Applicant: Signal Hound, INC., La Center, WA (US)

(72) Inventor: Justin Crooks, La Center, WA (US)

(73) Assignee: Signal Hound, INC., La Center, WA (US)

( * ) Notice: Subject to any disclaimer, the term of this patent is extended or adjusted under 35 U.S.C. 154(b) by 0 days.

(21) Appl. No.: 16/208,056

(22) Filed: Dec. 3, 2018

(65) Prior Publication Data
US 2019/0113552 A1    Apr. 18, 2019

Related U.S. Application Data

(63) Continuation of application No. 14/642,373, filed on Mar. 9, 2015, now Pat. No. 10,145,872, which is a (Continued)

(51) Int. Cl.
*G01R 23/16* (2006.01)
*H04L 27/227* (2006.01)
*G01R 19/02* (2006.01)

(52) U.S. Cl.
CPC ............ *G01R 23/16* (2013.01); *G01R 19/02* (2013.01); *H04L 27/2272* (2013.01)

(58) Field of Classification Search
CPC ...... G01R 19/02; G01R 23/16; G01R 23/165; G01R 23/167; H04L 27/22; H04L 27/2271; H04L 27/2272; H04L 27/2649; H04L 27/3836; H04L 27/3881
USPC ....... 375/268, 269, 316, 320, 324, 326, 327, 375/340, 344, 346; 455/145, 146, 150.1, 455/164.1, 164.2, 165.1, 168.1, 179.1,
(Continued)

(56) References Cited

U.S. PATENT DOCUMENTS 5,818,883 A * 10/1998 Smith ...................... H04B 1/26
375/347
6,392,598 B1 * 5/2002 Jones ...................... G01S 3/023
342/174
(Continued)

*Primary Examiner* — Young T Tse
(74) *Attorney, Agent, or Firm* — Rylander & Associates, PC; Philip R. M. Hunt

(57) ABSTRACT

A method for spurious signal reduction when measuring a spectrum of a radio frequency signal over a frequency span. The radio frequency signal is converted to a sequence of intermediate frequency signals using a sequence of local oscillator signals each having a different frequency. The sequence of intermediate frequency signals are converted to a sequence of digitized intermediate frequency signal sample sets, each set having a frequency value and a signal energy value. The frequency span is divided into frequency sample bins. For each frequency sample bin, all frequency domain samples from the sequence of frequency domain sample sets having a frequency value within the frequency sample bin are associated with that sample bin. For each frequency sample bin, of the frequency domain samples associated with that frequency bin, the frequency domain sample having the signal energy value that is lowest is selected for a combined frequency domain sample set.

4 Claims, 4 Drawing Sheets

Related U.S. Application Data continuation of application No. 13/026,876, filed on Feb. 14, 2011, now Pat. No. 8,977,519.

(60) Provisional application No. 61/304,291, filed on Feb. 12, 2010.

(58) Field of Classification Search
USPC ......... 455/180.1, 180.3, 183.1, 183.2, 189.1, 455/191.3, 196.1, 338, 339
See application file for complete search history.

(56) References Cited

U.S. PATENT DOCUMENTS

| | | | |
|---|---|---|---|
| 6,700,536 B1* | 3/2004 | Wiegand | G01S 3/023 342/417 |
| 2009/0115659 A1* | 5/2009 | Watanabe | G01S 19/33 342/357.73 |
| 2009/0135781 A1* | 5/2009 | Vaisanen | H04B 1/0057 370/330 |

* cited by examiner

SPECTRUM ANALYZER USING MULTIPLE INTERMEDIATE FREQUENCIES AND MULTIPLE CLOCK CONFIGURATIONS FOR RESIDUAL, SPURIOUS AND IMAGE SIGNAL REDUCTION

CROSS-REFERENCE TO RELATED APPLICATION

This application is a continuation application of U.S. Non-Provisional patent application Ser. No. 14/642,373 filed Mar. 9, 2015, now U.S. Pat. No. 10,145,872, which is a continuation application of U.S. Non-Provisional patent application Ser. No. 13/026,876 filed Feb. 14, 2011, now U.S. Pat. No. 8,977,519, which claims priority to U.S. Provisional Patent Application Ser. No. 61/304,291 filed Feb. 12, 2010, all incorporated herein by reference.

FIELD OF THE INVENTION

The present invention relates generally to electronic test equipment, and more particularly, to radio frequency (RF) spectrum analyzers and measuring receivers.

BACKGROUND

The term "spectrum analyzer" refers to a device used to examine the spectral composition of a radio frequency (RF) input signal. A typical spectrum analyzer will allow a user to select a frequency span defined by a span center frequency and a span width. The typical spectrum analyzer will then divide the frequency span into segments ("bins") and for each frequency bin in the span, measure input signal energy associated with frequencies in the bin. The result is typically shown on a visual display as a graph with the frequencies of the span on the horizontal axis and the input signal energy per bin on the vertical axis. The RF input signal may comprise one or more component signals at different frequencies, each displayed as a peak on the vertical axis.

A digital spectrum analyzer typically consists of several sections, including an RF section, a local oscillator (LO) section, an intermediate frequency (IF) section, a digital processing section and a display. The RF section typically includes an attenuator to reduce the RF input signal amplitude, one or more stages of mixers to convert the RF input signal to an intermediate frequency (IF) signal using local oscillator signals from one or more local oscillators (LO) in the LO section. The IF signal has several components. A desired component is a frequency shifted version of the input RF. The IF signal will also have undesired components, including residual, spurious and image signals. The IF section typically has a system of filtering the IF signal to eliminate out-of-band signals, including IF signal components that are frequency shifted replicas of RF signal components that were not in the selected span and including some of the unwanted residual, spurious and image signals. The IF section also typically has an analog to digital converter for converting the analog IF signal to a set of digitized IF signal samples. The digital processing section typically has hardware or software for performing additional filtering, for performing Fast Fourier Transforms (FFT) of the time domain set of digitized IF signal samples to a frequency domain set of digitized IF signal samples and for making various measurements of the digital time and frequency domain sets of the IF signal samples.

Spectrum analyzers generate undesired residual, spurious and image signals. Residual signals are false signals that are displayed with no input into the spectrum analyzer, and are typically generated from the electronic circuitry of the spectrum analyzer itself. Spurious signals ("spurs") are false signal products that result when an input signal is applied. Image signals are the undesired one of a summed frequency signal and a difference frequency signal, both of which are generated when mixing the RF input signal with an LO signal.

To minimize the introduction of unwanted residual signals, a spectrum analyzer typically isolates the LO, RF, IF and digital processing sections using shielding, which adds considerable weight and cost. Spectrum analyzers often use a Yttrium Iron Garnet (YIG) LO, which requires several watts of power and is expensive, but provides a clean signal which adds minimal phase noise to the input signal.

Measuring receivers are used to measure precise relative signal amplitude measurements over a wide dynamic range, measure peak and average modulation characteristics and apply filters to the IF analog and digital signals. Frequency modulation and amplitude modulation characteristics may be measured. Precise amplitude steps may be measured as well. Measuring receivers are typically separate devices from spectrum analyzers, in spite of sharing many functional blocks.

Many modern spectrum analyzers use the Fast Fourier Transform (FFT) technique to convert time-domain signal data into frequency-domain signal data. Processing high-resolution FFTs quickly requires a powerful processor.

Handheld spectrum analyzers contain less expensive, less accurate components, have less shielding and consume less power than a traditional rack-mount spectrum analyzer. They typically have a low resolution display and buttons for a user interface. They are generally not capable of processing automated commands and are of minimal usefulness in a lab setting. They generally have slower processors which are not capable of quickly processing very large FFTs. With less accurate components, less powerful processors and less shielding, handheld spectrum analyzers do a poor job of reducing residual, spurious and image signals and have poorer overall results than a larger, high quality spectrum analyzer.

RF cables are often used to connect spectrum analyzers to a signal being measured and can be a major source of measurement inaccuracies. RF cables typically have unknown, frequency-dependent losses which change as the cable is bent or twisted. It is often not very convenient to place a large spectrum analyzer near the source of an RF signal or orient it in such a way to minimize bending of the RF cables.

Owning a modern spectrum analyzer with good specifications is currently cost prohibitive for many students, inventors, and amateur radio enthusiasts.

What is needed is an ultra-low-cost, low-power, light-weight, portable spectrum analyzer similar in size and weight to a traditional RF power sensor; a spectrum analyzer that can be connected close to the source of a signal being measured without long intervening RF probe cables yet carries the signal processing power of the modern personal computer.

SUMMARY AND ADVANTAGES

An embodiment of a spectrum analyzer is disclosed herein for measuring an RF signal over a selected frequency span, the spectrum analyzer configured to use multiple Local Oscillator (LO) signals to generate multiple Intermediate Frequencies (IFs) for residual, spurious and image signal reduction. The disclosed spectrum analyzer has both a primary IF path and a secondary IF path, each configured to provide band pass filtering of the multiple IF signals. A master clock synthesizer is configured to reduce residual noise by providing a master clock signal and a second stage Local Oscillator (LO) signal, both from a single Voltage Controlled Oscillator (VCO). The spectrum analyzer has a microcontroller configured to change the frequency of the master clock signal and the second stage LO signal if the center frequency of the selected span is sufficiently close to a known spurious signal using the current second stage LO signal. The disclosed spectrum analyzer performs spectrum analysis on DC-coupled RF signals from 1 Hz to 4.4 GHz. The disclosed spectrum analyzer embodiment is USB bus-powered.

A method is disclosed for the selection of variable LO, clock, and IF frequencies to effectively mask out image, spurious and residual signals across several ranges of input frequencies. A method is disclosed for reducing the effects of internally generated residual signals. A method is disclosed for providing rapid frequency sweeps of large spans without the use of a sweep oscillator.

Additional advantages of the invention will be set forth in part in the description which follows, and in part will be obvious from the description, or may be learned by practice of the invention. The advantages of the invention may be realized and attained by means of the instrumentalities and combinations particularly pointed out in the appended claims. Further benefits and advantages of the embodiments of the invention will become apparent from consideration of the following detailed description given with reference to the accompanying drawings, which specify and show preferred embodiments of the present invention.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

REFERENCE NUMBERS USED IN DRAWINGS

Figure 1:
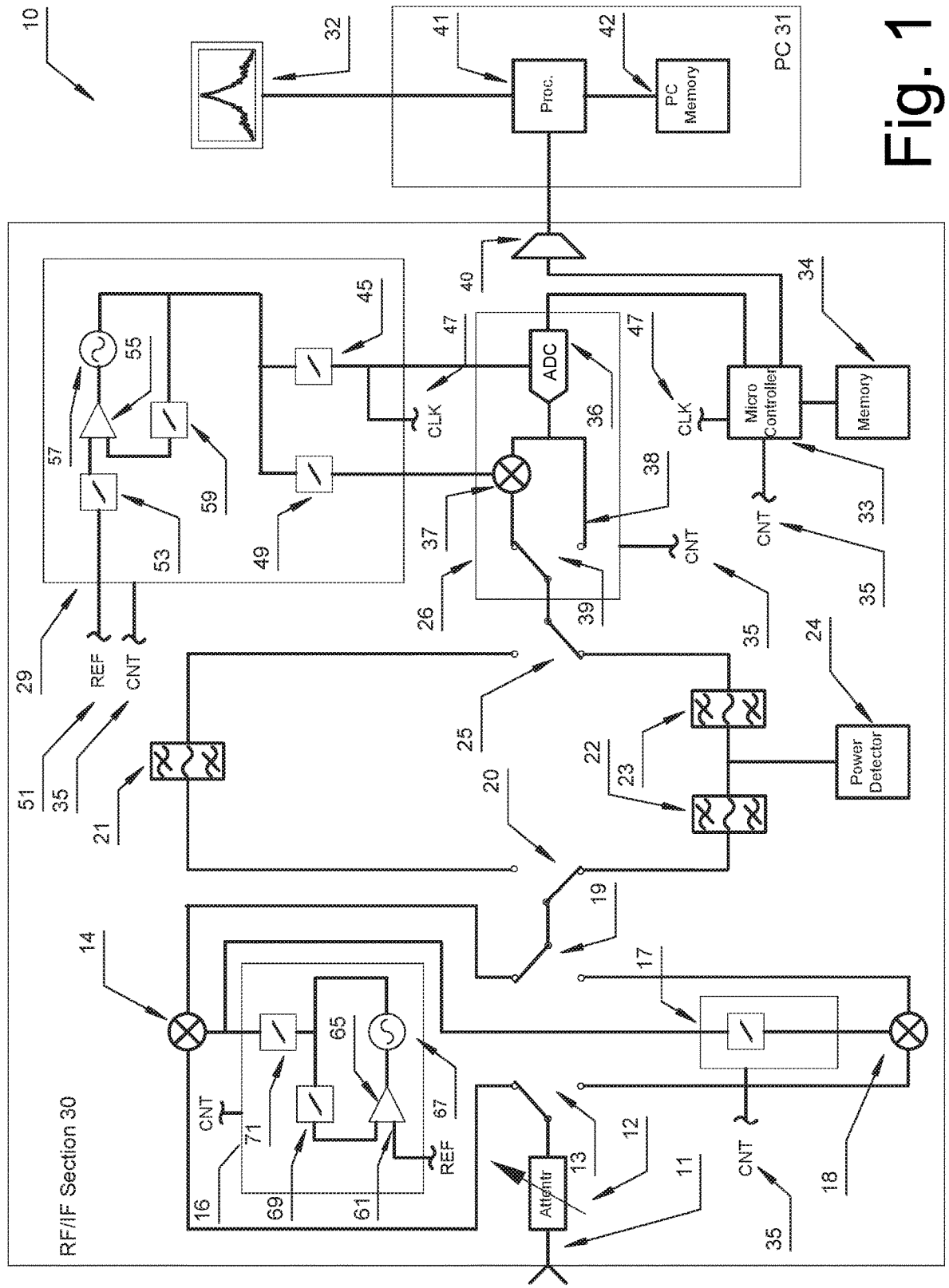
FIG. 1 is a block diagram of the spectrum analyzer in accordance with an exemplary embodiment of the present invention.

Turning now descriptively to the drawings, in which similar reference characters denote similar elements throughout the several views, the figures illustrate the spectrum analyzer of the present invention. With regard to the reference numerals used, the following numbering is used throughout the various drawing figures:

| Reference Numbers | Part References |
|---|---|
| 10 | spectrum analyzer |
| 11 | RF input |
| 12 | input attenuator |
| 13 | first RF path switch |
| 14 | high band mixer |
| 16 | wideband synthesizer |
| 17 | low band divider |
| 18 | low band mixer |
| 19 | second RF path switch |
| 20 | first IF path switch |
| 21 | secondary IF filter |
| 22 | primary IF impedance matching network |
| 23 | primary IF filter |
| 24 | wideband RMS power detector |
| 25 | second IF path switch |
| 26 | IF-to-Bits circuit IC |
| 29 | master clock synthesizer |
| 30 | RF/IF section |
| 31 | personal computer PC |
| 32 | display |
| 33 | microcontroller |
| 34 | memory |
| 35 | control line |
| 36 | Analog to Digital Convertor ADC |
| 37 | second stage mixer |
| 38 | mixer bypass |
| 39 | mixer bypass switch |
| 40 | data port |
| 41 | processor |
| 42 | pc memory |
| 45 | clock divider |
| 47 | clock line |
| 49 | second stage LO divider |
| 51 | reference signal input |
| 53 | reference divider |
| 55 | master phase comparator |
| 57 | master VCO |
| 59 | master VCO divider |
| 61 | LO reference signal input |
| 65 | LO phase comparator |
| 67 | LO VCO |
| 69 | LO VCO counter |
| 71 | high band divider |

DETAILED DESCRIPTION

Before beginning a detailed description of the subject invention, mention of the following is in order. When appropriate, like reference materials and characters are used to designate identical, corresponding, or similar components in differing figure drawings. The figure drawings associated with this disclosure typically are not drawn with dimensional accuracy to scale, i.e., such drawings have been drafted with a focus on clarity of viewing and understanding rather than dimensional accuracy.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

FIG. 1 shows an embodiment of a spectrum analyzer 10 configured to generate multiple Intermediate Frequencies (IF) for residual, spurious and image signal reduction. The spectrum analyzer 10 is configured to examine the spectral composition of a radio frequency (RF) input signal. The spectrum analyzer 10 is configured to allow a user to select a frequency span by selecting a span center frequency and a span width. The spectrum analyzer 10 is configured to divide the frequency span into segments ("bins") and for each frequency bin in the span, measure input signal energy associated with frequencies in the bin. The spectrum analyzer 10 is comprised of an integrated RF/IF section 30, a personal computer (PC) 31 configured for digital signal processing and a display 32. The RF/IF section 30 is configured to convert the RF signal to a first set of digitized IF signal samples using a first Local Oscillator (LO) signal that has a first LO frequency and to convert the RF signal to a second set of digitized IF signal samples using a second Local Oscillator (LO) signal that has a second LO frequency. The PC 31 is configured to convert the first and second set of digitized IF signal samples to first and second sets of frequency domain samples. The PC 31 is further configured to combine the first and second set of frequency domain samples into a combined set of frequency domain samples by selecting, for each frequency sample bin, the lower valued frequency domain sample of the first and second IF frequency domain samples associated with that frequency sample bin. The display 32 is configured to visually present the combined frequency domain samples.

The RF/IF section 30 has master clock synthesizer 29 configured to provide clocking to the various components of the RF/IF section using methods that reduce or eliminate unwanted residual and spurious signals. The RF/IF section 30 includes an RF/IF microcontroller 33 configured to execute various procedures to control and coordinate the actions of the various RF/IF section 30 components over control lines 35 and an RF/IF memory 34 configured to store the instructions for the various control procedures.

An RF portion of the RF/IF section 30 includes an RF input 11, an input attenuator 12, a first RF path switch 13, a high band mixer 14, a low band mixer 18, a second RF path switch 19, a wideband synthesizer 16, and a low band divider 17. A high band RF path is defined as a signal path from the first RF path switch 13 through the high band mixer 14 to the second RF path switch 19. A low band RF path is defined as a signal path from the first RF path switch 13 through the low band mixer 18 to the second RF path switch 19. An RF signal applied to the RF input 11 is routed to the input attenuator, which in the exemplary embodiment is a CMOS digital step attenuator. The attenuated RF signal is then routed to the first RF path switch 13, selecting the high band RF path leading to the high band mixer 14 or the low band RF path leading to the low band mixer 18. A high band local oscillator (LO) signal for the high band mixer 14 is generated by the wideband synthesizer 16. A low band LO signal for the low band mixer 18 comes from the low band divider 17 which is driven by the high band LO signal generated by the wideband synthesizer 16. When the first and second RF path switches are selected for the high band RF path, the attenuated RF signal is mixed with the high band LO signal in the high band mixer 14 to produce an IF signal. When the first and second RF path switches are selected for the low band RF path, the attenuated RF signal is mixed with the low band LO signal in the low band mixer 18 to produce an IF signal. All IF signals generated by either the high band mixer 14 or the low band mixer 18 are considered first stage IF signals. Two different RF paths are provided because a practical RF mixer will not perform well at both high and low frequencies. The low band mixer 18 is selected to have good performance at low frequencies and the high band mixer 14 is selected to have good performance at high frequencies. In the exemplary embodiment, the low band mixer 18 is a Mini-Circuits ADE-1ASK and the high band mixer is a Mini-Circuits ADE-42MH. In the exemplary embodiment, the low band RF path is used for RF signals with frequencies equal to or less than 150 MHz and the high band RF path is used for RF signals with frequencies greater than 150 MHz.

The RF/IF section 30 is configured to generate each LO signal with a frequency selected such that when the LO signal is mixed with the RF signal, the IF signal generated is the RF signal frequency shifted to a primary IF or a secondary IF. That is, the IF signal will have energy at the primary IF in proportion to energy at the center span frequency in the RF signal and, each IF frequency will have energy in the same proportion to energy in an RF frequency where the difference between the IF frequency and the primary IF is the same as the difference between the RF frequency and the center span frequency of the RF signal. In the exemplary embodiment, the primary IF is 10.7 MHz and the secondary IF is 2.9 MHz.

The RF/IF section 30 is configured to sequentially convert the RF signal to a first IF signal using a first LO signal with a first LO frequency, then convert the RF signal to a second IF signal using a second LO signal with a second LO frequency. In some instances, both first and second IF signals are generated sequentially by the high band mixer 14, one after the other. In other instances, one of the IF signals is generated by the high band mixer 14 while the other IF signal is generated by the low band mixer 18. In yet other instances, both first and second IF signals are generated sequentially by the low band mixer 18, one after the other.

The low band mixer 18 is placed in the low band RF signal path with IF and RF ports reversed, allowing frequencies down to DC to be up-converted, or higher frequencies to be down-converted, without changing hardware configuration.

The RF/IF section 30 includes an IF filtering portion with a first IF path switch 20, a secondary IF filter 21, a primary IF impedance matching network 22, a primary IF filter 23, a wideband RMS power detector 24 and a second IF path switch 25. A primary IF path is defined as a signal path from the first IF path switch 20 through the primary IF filter 23 to the second IF path switch 25. A secondary IF path is defined as a signal path from the first IF path switch 20 through the secondary IF filter 21 to the second IF path switch 25. The secondary IF filter 21 has center frequency selected to match the secondary IF. The primary IF impedance matching network 22 and primary IF filter 23 have center frequencies selected to match the primary IF. In the exemplary embodiment, the secondary IF filter 21 has a center frequency of 2.9 MHz and the primary IF impedance matching network 22 and primary IF filter 23 have center frequencies of 10.7 MHz. The bandwidth of the secondary IF filter 21 and the primary IF filter 23 are selected to match the bandwidth of the ADC 36. The bandwidth of the primary IF impedance matching network 22 is selected to facilitate large span measurements using the RMS power detector 24, which will be described in greater detail below. In the exemplary embodiment, the secondary IF filter 21 and the primary IF filter 23 have bandwidths of 280 kHz. The bandwidth of the primary IF impedance matching network 22 is 5 MHz.

The RF/IF section 30 is configured to sequentially convert the RF signal to a first IF signal using a first LO signal with a first LO frequency, then convert the RF signal to a second IF signal using a second LO signal with a second LO frequency. In some instances, both first and second IF signals pass through the primary IF path, one after the other. In other instances, one of the IF signals passes through the primary IF path while the other IF signal passes through the secondary IF path. In yet other instances, both first and second IF signals pass through the secondary IF path, one after the other.

The RF/IF section 30 includes a second stage IF mixing portion which includes a second stage mixer 37, a mixer bypass 38, and a mixer bypass switch 39. The second stage IF mixing portion is followed by an Analog to Digital Converter (ADC) 36. If the second IF path switch 25 is set to shunt an IF signal from the primary IF path, then the mixer bypass switch 39 is configured to shunt the IF signal to the second stage mixer 37. The second stage mixer 37 is configured to convert the first stage, primary IF signal into a second stage IF signal using a second stage LO signal with a second stage LO. The frequency of the second stage LO is selected to make center frequency of the second stage IF signal match the center frequency of the ADC 36. If the second IF path switch 25 is configured to shunt an IF signal from the secondary IF path, then the mixer bypass switch 39 is set to shunt the IF signal through the mixer bypass 38 and straight to the ADC 36. The ADC 36 is configured to convert either the second stage IF signal or the secondary IF signal, depending on the state of the mixer bypass switch 39, into a set of digitized IF signal samples comprising interleaved in-phase and quadrature-phase (I/Q) data samples. The ADC 36 sends the set of digitized IF signal samples as a serial digital signal, via microcontroller 33 and a data port 40, out of the RF/IF section 30 to the PC 31. In the exemplary embodiment, the data port 40 conforms to one of the Universal Serial Bus standards.

In the exemplary embodiment, an "IF-to-bits" integrated circuit (IC) 26, the Analog Devices AD9864, is used to provide the second stage mixer 37, the mixer bypass 38, the mixer bypass switch 39 and the ADC 36. In the AD9864, the center frequency of the ADC 36 is ⅛ of the frequency of the clock signal provided to the ADC 36.

The RF/IF section 30 having two IF paths can produce some distinct advantages. In the exemplary embodiment, The 2.9 MHz secondary IF path yields a flat response and is 10 dB more sensitive than the 10.7 MHz primary IF path, but has much larger spurious signals from poorly filtered out-of-band signals. The 10.7 MHz primary IF path, with its additional filtering and mixing stage, is less sensitive but provides better out-of-band spurious rejection. Measurements are further enhanced by setting one local oscillator signal to yield an IF signal with the 2.9 MHz secondary IF and using the 2.9 MHz secondary IF path while setting the second local oscillator signal to yield an IF signal with the 10.7 MHz primary IF and using the 10.7 MHz primary IF path. The displayed average noise level benefits from the sensitivity of the 2.9 MHz secondary IF path while the spurious signals are by and large masked out by combining the digitized 2.9 MHz IF signal with the 10.7 MHz IF signal in the masking process.

The PC 31 has a processor 41 and a PC memory 42. The processor 41 is configured to execute digital signal processing (DSP) methods for processing the sets of digitized IF signal samples received from the RF/IF section 30. Such methods include performing FFTs on the first and second set of digitized IF signal samples to transform them into first and second sets of frequency domain samples; and combining first and second sets of frequency domain samples into a composite set of frequency domain samples, masking out unwanted images and spurious signals in the process. The PC memory 42 is configured to store the instructions for the DSP methods. The PC memory 42 may also be configured to store the combined frequency signals. The PC memory 42 may be volatile or non-volatile memory.

The RF/IF path switches (the first RF path switch 13, the second RF path switch 19, the first IF path switch 20, the second IF path switch 25 and the mixer bypass switch 39) are all controlled by the RF/IF microcontroller 33 through control lines 35. In the exemplary embodiment, the RF/IF path switches are transistor switches capable of sub-millisecond switching.

The RF/IF section 30 has a master clock synthesizer 29 configured to generate the second stage LO signal and a master clock signal. The master clock synthesizer 29 comprises an internal integer-N Phase Lock Loop (PLL) that includes a reference signal input 51, a reference divider 53, a master phase comparator 55, a master Voltage Controlled Oscillator (VCO) 57, and a master VCO divider 59. The PLL is configured to convert a frequency reference signal to a master VCO signal. The master VCO 57 generates the master VCO signal at a frequency controlled by a voltage supplied by the master phase comparator 55. The reference divider 53 divides the frequency of the reference signal $F_{ref}$ by a reference divisor M, resulting in a signal to the master phase comparator 55 with a frequency 1/M of the reference frequency. The master VCO divider 59 divides the frequency of the master VCO signal ($F_{MVS}$) by a master VCO divisor $N_{MV}$, resulting in a signal to the phase comparator with a frequency $1/N_{MV}$ of the master VCO signal frequency. As such, the PLL will lock the master VCO signal frequency $F_{MVS}$ equal to the reference signal $F_{ref}$ times the reference divisor M divided by the master VCO divisor $N_{MV}$, as stated by the equation: $F_{MVS} = F_{ref} \times M\ N_{MV}$.

The master clock synthesizer 29 has a second stage LO divider 49 configured to divide the master VCO signal by a second stage LO divisor integer $N_{LO2}$ to produce the second stage LO signal at a second stage LO frequency $F_{LO2}$ that is $1/N_{LO2}$ of the master VCO signal frequency. The master clock synthesizer 29 has a second stage LO signal output configured to send the second stage LO signal to the second stage mixer 37.

The master clock synthesizer 29 has a clock divider 45 configured to divide the master VCO signal by a clock divisor integer $N_{CLK}$ to produce a master clock signal at a master clock signal frequency $F_{CLK}$ that is $1/N_{CLK}$ of the master VCO signal frequency. The master clock synthesizer 29 has clock outputs configured to send the master clock signal to the ADC 36 and also to the RF/IF microcontroller 33 via a clock line 47.

Providing both the clocking to the ADC 36 and the LO signal to the second stage mixer 37 from the same VCO reduces the amount of noise introduced to the IF signals. Additionally, all the other components in the RF/IF section 30 that require clocking either receive the master clock signal directly from the master clock synthesizer 29 or from the RF/IF microcontroller 33, which may divide down the frequency for other components. Thus all major sources of clock noise are at substantially the same frequency or fractions thereof, which makes mitigating clock induced noise a simpler task.

The values of the master clock synthesizer 29 divisors (the reference divisor M, the master VCO divisor $N_{MV}$, the clock divisor integer $N_{CLK}$, and the second stage LO divisor integer $N_{LO2}$) are closely interrelated and should be selected carefully. There are several considerations. In the exemplary embodiment, the master clock synthesizer 29 is a Texas Instruments CDCE906. Values must be found so that the master VCO 57 operates at frequencies in its allowable range, which for the CDCE906 is between 100 MHz and 200 MHz. Values must be found so that the resulting second stage IF signal after second stage LO mixing has a center frequency near to the center frequency of the ADC 36, which for the AD9864 is one-eighth of the frequency of the clock supplied to the ADC 36. Better control of phase noise is achieved where $N_{MV}$ is kept to a minimum and values selected that have been found not to produce overlapping spurious signals. In the exemplary embodiment, a reference signal with a frequency of 10 MHZ is used.

In the exemplary embodiment, three configurations of the master clock synthesizer 29 are used, as shown in Table 1:

TABLE 1

| Config. | M | $N_{MV}$ | $N_{CLK}$ | $N_{LO2}$ | $F_{MVS}$ | $F_{CLK}$ | $F_{LO2}$ |
|---|---|---|---|---|---|---|---|
| 1 | 14 | 1 | 6 | 18 | 140 MHz | 23⅓ MHz | 7⅑ MHz |
| 2 | 27 | 2 | 6 | 10 | 135 MHz | 22½ MHz | 13.5 MHz |
| 3 | 327 | 2 | 7 | 21 | 163.5 MHz | 23 6/17 MHZ | 7.784 MHz |

The values in configurations 1-3 were selected for their non-overlapping residual and spurious signals as well as their low divisors. The third configuration is needed to avoid residual signals from the master clock signal frequencies in the first two configurations, at multiples of 630 MHz. The third configuration has spurious signals at frequencies that are dissimilar to the other configurations.

If self-generated residual or spurious signals occur at the RF frequency being measured, the clock frequency is automatically changed to reduce interference. Changing clock frequencies needs to occur quickly and seamlessly. To accomplish this, the RF/IF microcontroller 33 switches the clocking between measurements. The RF/IF microcontroller 33 first switches to an internal resistor-capacitor (RC) clock, then writes the new clock settings to the master clock synthesizer 29, and finally switches back to the master clock signal when it is stable at the new master clock frequency. This is transparent to the user.

The wideband synthesizer 16 comprises a fractional-N Phase Lock Loop (PLL) that includes an LO reference signal input 61, an LO phase comparator 65, an LO Voltage Controlled Oscillator (VCO) 67, and an LO VCO counter 69. The PLL is configured to convert a frequency reference signal to an LO VCO signal. The LO VCO 67 generates the LO VCO signal at a frequency controlled by a voltage supplied by the LO phase comparator 65. The reference signal $F_{ref}$ is fed to the LO phase comparator 65. The LO VCO counter 69 alters the LO VCO signal frequency ($F_{LVS}$) by a multiple of an LO counter factor ($CF_{LO}$), which is equal to the quantity of an integer A, plus a numerator B divided by denominator C, the quantity divided by 2 to the power of a post-scalar factor P. As such, the PLL will lock the LO VCO signal frequency $F_{LVS}$ equal to the reference signal $F_{ref}$ times the LO counter factor ($CF_{LO}$), as stated by the equation: $F_{LVS}=F_{ref} \times (A+B/C)/2^P$. In the exemplary embodiment, the wideband synthesizer 16 is an Analog Devices ADF4350. For the ADF4350 integer A can have values of 220-440 inclusive. Numerator B is forced to be less than 900, typically much less. Denominator C can be equal to or greater than 2 and less than 900, must be a prime number, and is typically less than 100. The post-scalar factor P can be 0-4 inclusive, or 4-10 inclusive when using the ADF4007 for the low band divider 17.

In the exemplary embodiment, reference signal $F_{ref}$ at 10 MHz is converted to an LO VCO signal at an LO VCO frequency $F_{LVS}$ between 2.2 GHz and 4.4 GHz, which is then divided in a high band divider 71 by 1, 2, 4, 8, or 16 internally to produce the high band LO signal for the high band mixer 14. The high band LO signal is further divided externally by 8, 16, 32, or 64 in the low band divider 17 to produce the low band LO signal for the low band mixer 18. In the exemplary embodiment, the low band divider 17 is an Analog Devices ADF4007.

Fractional-N spur signals are injected into the IF signal by the wideband synthesizer 16 as a function of denominator C and post-scalar factor P. As discussed above, image and spur rejection is achieved by mixing the RF signal with two distinct LO signals at different frequencies to generate two IF signals, combining the frequency-domain samples of the two IF signals, then for each frequency bin in the selected span, accepting only the lower valued frequency domain sample associated with that frequency sample bin, thereby masking out unwanted residual, spurious and image signals since each such unwanted signal occurs at a different frequency in each of the two IF signals. For most pairs of LO signals, values of the denominator C used to generate them will be such that the fractional-N spur signals do not occur at the same frequency and the spurs will be masked out. However, it is possible that values of denominator C can be selected such that some of the fractional-N spurs occur at the same frequency and will not be masked out. To ensure that fractional-N spurs from the LOs are masked out, values for the denominator C must be prime, but different, integers for the two selected frequencies. The two distinct values of C each must be the minimal values for which an LO frequency exists that is sufficiently close to the ideal LO frequency for the desired measurement. In the exemplary embodiment, an LO frequency within 5% of the center frequency of the span under test+5 kHz is considered sufficiently close.

Additionally, the ADC 36 has a residual signal which needs to be eliminated. Integer A, numerator B, denominator C and post-scalar P are selected such that the LO spurs and the ADC 36 residual signals are not overlapping. Thus any image, residual, and spurious signal do not line up at the same frequency in an IF signal generated at one LO frequency as they will in an IF signal generated at another LO frequency and are canceled during the masking process.

In the exemplary embodiment, twelve distinct combinations of clocks and mixing are available for each RF frequency span examined. The LO signal can be injected with a frequency on the high side of the RF signal or on the low side, the resulting IF can be 2.9 MHz or 10.7 MHz, and one of three clock configurations can be selected. This allows substantial flexibility when reducing image, spur and residual signals. This flexibility in system clocks also reduces the need for shielding since the spectrum analyzer 10 can automatically configure clocking to avoid self-generated noise. This reduces overall size and weight, allowing construction of a smaller, more portable device. Increased portability will in many cases eliminate the need for an RF cable between the RF/IF section 30 and the source of RF signal being measured, yielding a spectrum analyzer that can be connected like an RF power sensor and benefit from the increased accuracy from the lack of RF cables.

These features of the spectrum analyzer 10 allow RF and IF sections of the spectrum analyzer 10 to be integrated more closely and with less shielding than in previous designs, providing for a more compact and lower cost device. However, one of skill in the art will realize that the various innovative features described herein may be practiced without integrating the RF and IF sections and eliminating shielding.

For very low RF frequencies, near or below the operating frequency of the low band mixer 18 or the low band divider 17, image suppression cannot be achieved by mixing the RF signal with LO signals with frequencies on the high side and low side of the RF signal. Instead, two local oscillator signals are used with LO signals with frequencies on the high side of the RF signal separated only by tens of kilohertz. The aforementioned masking technique is used to reject the image, since the image will shift the opposite direction than the desired signal.

To achieve full span sweeps of 4.25 GHz in just a few seconds, the ADC 36 cannot be utilized due to its narrow bandwidth. Therefore, a wideband RMS power detector 24 monitors the output of the primary IF impedance matching network 22. The bandwidth of ~5 MHz allows stepping of the LO by 3 MHz across the selected span and taking a wide IF power level reading at each step. By assuming the RF input signal will at each step produce a high-side IF signal with peaks at frequencies that are a sum of the RF and LO frequencies and a low-side IF signal with peaks at frequencies that are a difference of the RF and LO frequencies, the spectrum analyzer 10 can mask out any low-side IF signal peak that does not have a corresponding high-side IF signal peak, then take a series of more accurate power readings at frequencies near the low side IF signal peaks using the ADC 36. Thusly, a full span sweep can be achieved with full amplitude accuracy in a few seconds.

Figure 2:
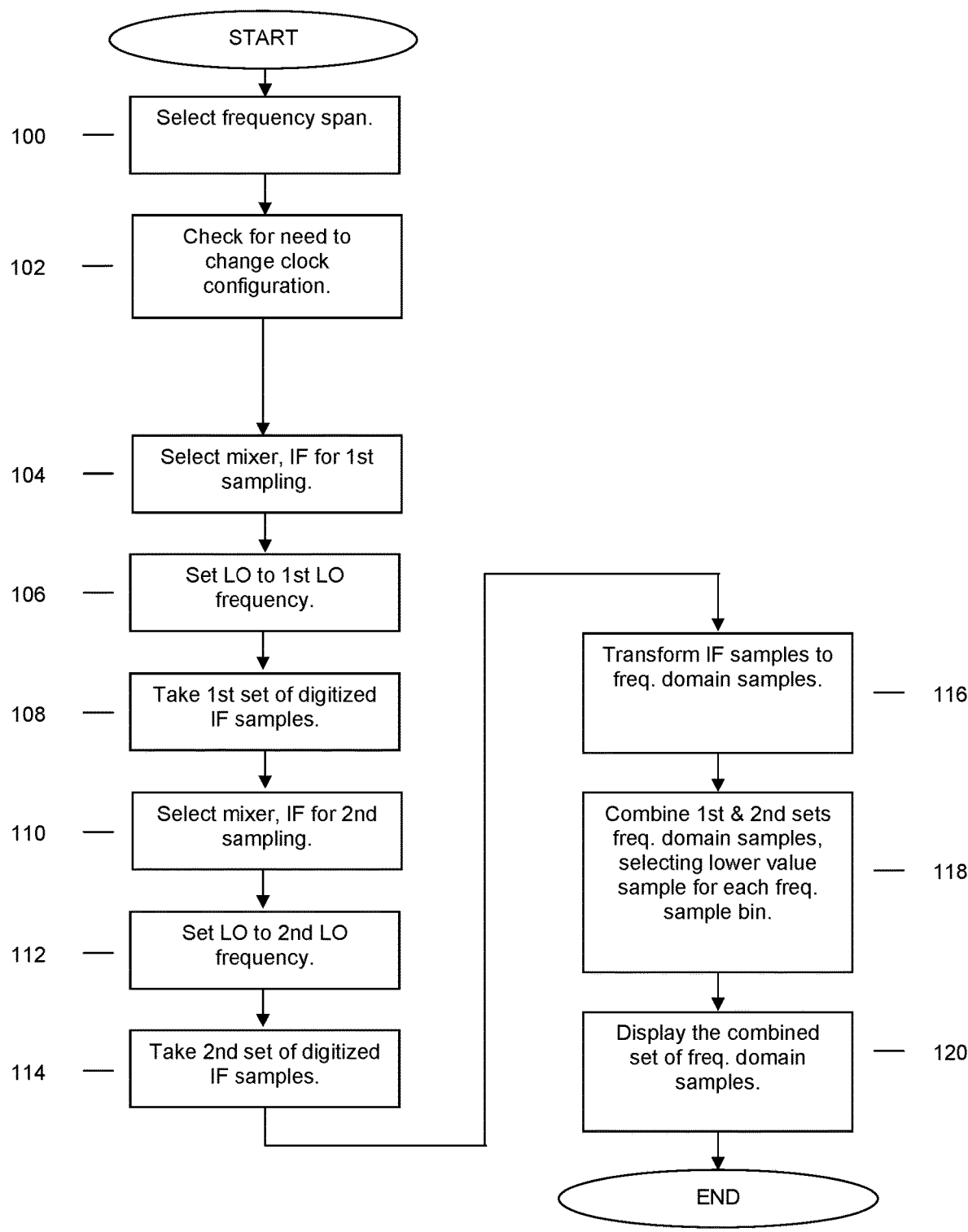
FIG. 2 shows a flow chart of a method used by the spectrum analyzer of FIG. 1 for measuring the RF signal.
Figure 3:
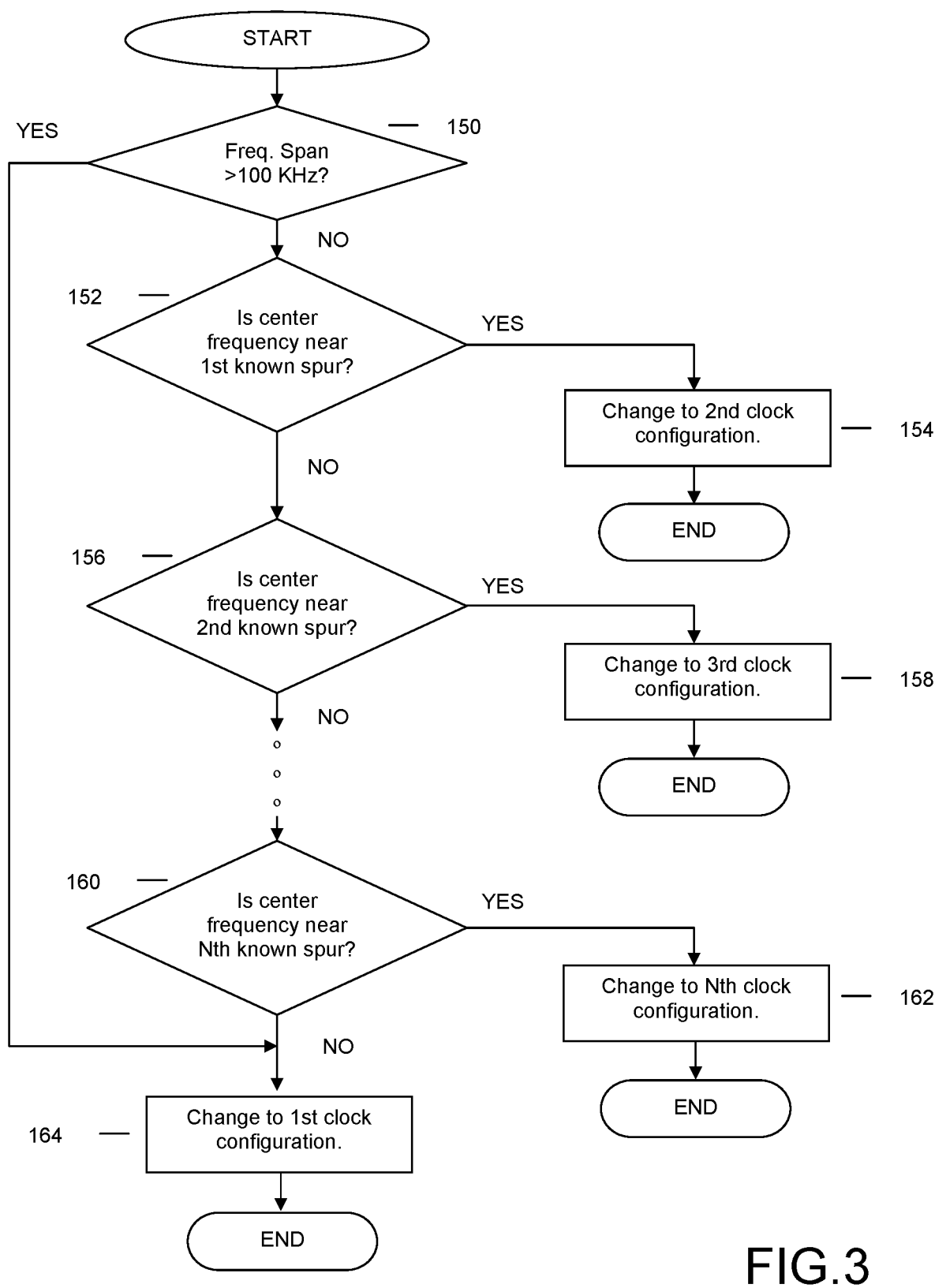
FIG. 3 shows a flow chart of a method for a spectrum analyzer to change clocking configuration to eliminate spurious signals when measuring an RF signal over a selected frequency span with a center frequency.

FIG. 2 shows a flow chart of a method used by the spectrum analyzer 10 of FIG. 1 for measuring the RF signal. Step 100 is selecting a frequency span. This step may be performed manually by a user manipulating controls or by commands from an automated script. Step 102 is checking whether the clocking configuration needs to be changed. This is a check for known spurious signals generated by clocking within the spectrum analyzer that may be near to the center frequency of the span. FIG. 3 discusses this step is greater detail.

Step 104 is selecting an intermediate frequency (IF) for the first sampling from one of a primary IF and secondary IF. To obtain a measurement of the selected frequency span, at least two samplings are performed. If the width of the span is larger than the bandwidth of the ADC 36, then the span is divided into segments each equal to the width of the ADC 36 bandwidth and two samplings are performed for each segment. Step 104 also includes selecting a mixer for a first sampling. Either the high band mixer 14 or low band mixer 18 may be selected. In the exemplary embodiment, the high band mixer 14 is selected in all cases except where the center frequency of the selected frequency span is less than 150 MHz. Once IF and mixer have been selected for the first sampling, the RF/IF path switches are set to create a first signal path through the mixer for the first sampling and an IF path associated with the IF for the first sampling. Step 106 is setting a first stage local oscillator (LO) signal to a first LO frequency. This is based on the selected span and the IF selected for the first sampling. The LO frequency must be such that its sum or difference with the center frequency of the selected span equals the selected IF. Step 108 is taking a first set of digitized IF samples with the ADC 36.

Step 110 is selecting a mixer for the second sampling. Once again, either the high band mixer 14 or low band mixer 18 may be selected, regardless of the selection for the first sampling. Step 110 also includes selecting an intermediate frequency (IF) for the second sampling. Once again, either the primary IF or the secondary IF may be selected, regardless of the selection that was made for the first sampling. Once IF and mixer have been selected for the second sampling, the RF/IF path switches are set to create a second signal path through the mixer for the second sampling and an IF path associated with the IF for the second sampling. Step 112 is setting the first stage local oscillator (LO) to a second LO frequency. This is based on the selected span and IF for the second sampling. The LO frequency must be such that its sum or difference with the center frequency of the selected span equals the selected IF. Step 114 is taking a second set of digitized IF samples.

Step 116 is transforming the first and second sets of digitized IF samples to a first and a second set of frequency domain samples. This is done with an FFT. Step 118 is combining the first and second set of frequency domain samples into a combined set of frequency domain samples. The combining is done by looking at the samples associated with the same frequency sample bin in both sample sets and selecting whichever has a lower value frequency domain sample. The higher value frequency sample is discarded. In this way, unwanted signals are masked out, as they will only have peak values in one of the two sample sets.

Step 120 is displaying the combined set of frequency domain samples. In other embodiments, the combined set is stored. In yet other embodiments, the combined set is displayed and stored.

FIG. 3 shows a flow chart of a method for a spectrum analyzer to change clocking configuration to eliminate spurious signals when measuring an RF signal over a selected frequency span with a center frequency. Step 150 is checking the selected frequency span width and if the selected span is greater than 100 KHz wide then Step 164 is performed for changing to a first clock configuration (see Table 1 for clock configurations) and the method terminates. If the selected span is not greater than 100 KHz wide, then step 152 is performed.

Step 152 is checking if the center frequency of the selected span is near a first known spurious signal or integer multiples thereof and if so, Step 154 is performed for changing to a second clock configuration and the method terminates. In this method, the center frequency of the selected span is considered near a spurious signal if it is within half of the ADC 36 bandwidth. In the exemplary embodiment, half of the ADC 36 bandwidth is about 100 KHz. If the center frequency of the selected span is not near the first known spurious signal or integer multiples thereof, then step 156 is performed.

Step 156 is checking if the center frequency of the selected span is near a second known spurious signal or integer multiples thereof and if so, Step 158 is performed for changing to a third clock configuration and the method terminates. If the center frequency of the selected span is not near the second known spurious signal or integer multiples thereof, then step 160 is performed.

Steps 160 and 162 are repeats of steps 152 and 156 for an Nth known spurious signal or integer multiples thereof. In the exemplary embodiment, only two spurious signals are known: 630 MHz (and integer multiples thereof) and 23⅓ MHz (and integer multiples thereof).

Figure 4:
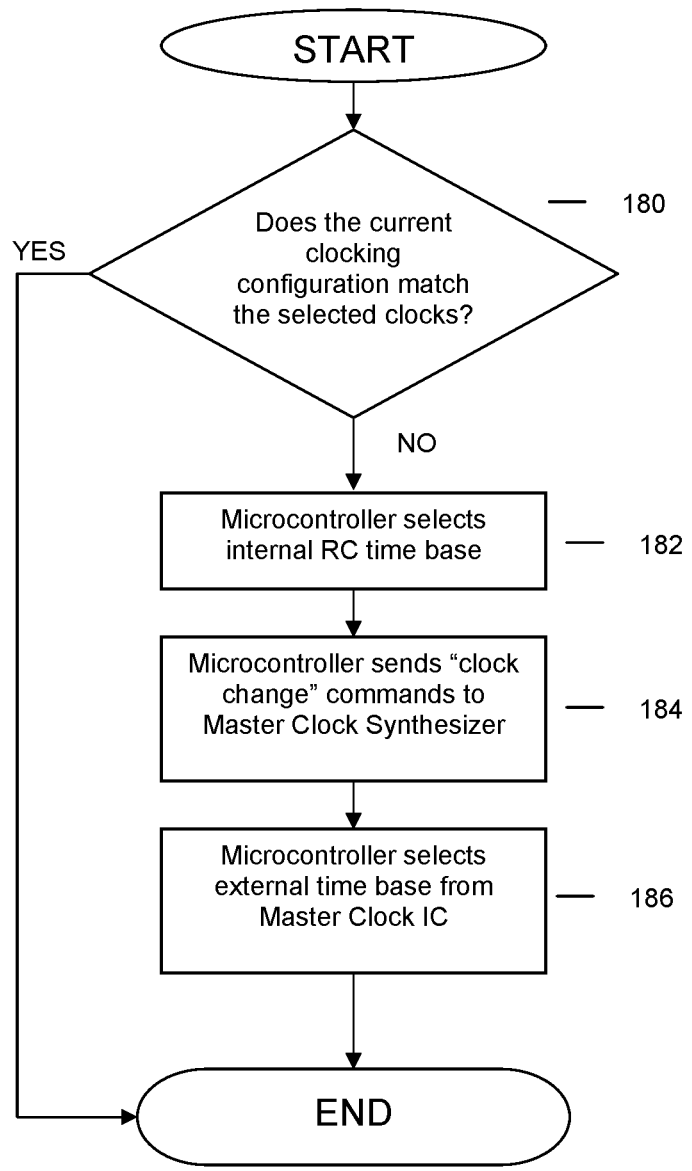
FIG. 4 shows a flow chart of a method for changing clock configuration.

FIG. 4 shows flow chart of a method for changing clock configuration. This method is performed after the method of FIG. 3 determines the clocking configuration to be used in a measurement. Step 180 is checking if the current clocking configuration matches that selected by the method of FIG. 3. If the current clocking configuration matches the selected clocking configuration, then this method terminates. If not, Step 182 is performed. Step 182 has the microcontroller 33 select an internal RC time base. Step 184 has the microcontroller 33 send a clock change command to the master clock synthesizer 29. Step 186 has the microcontroller select the clocking from the master clock signal through clock lines 47. This step is performed after the master clock synthesizer 29 has stabilized in its new configuration.

The advantages of this device and method include, without limitation, very low production cost, very light weight, reduced need for inner shielding, very good performance specifications in narrow resolutions, very good rejection of residual, spurious and image signals generated from the low-cost part selection, and accurate, repeatable measurements by connecting this device directly to the signal being measured without need for additional cables, similar to an RF power sensor but with full spectrum analysis and measuring receiver capabilities.

Those skilled in the art will recognize that numerous modifications and changes may be made to the preferred embodiment without departing from the scope of the claimed invention. It will, of course, be understood that modifications of the invention, in its various aspects, will be apparent to those skilled in the art, some being apparent only after study, others being matters of routine mechanical, chemical and electronic design. No single feature, function or property of the preferred embodiment is essential. Other embodiments are possible, their specific designs depending upon the particular application. As such, the scope of the invention should not be limited by the particular embodiments herein described but should be defined only by the appended claims and equivalents thereof.

What is claimed is:

1. A method comprising the steps of:
sequentially converting, using one or more mixers, a radio frequency signal to a sequence of intermediate frequency signals using a sequence of local oscillator signals generated by a local oscillator, each of the local oscillator signals having a different frequency;
sequentially converting, with an analog-to-digital converter, the sequence of intermediate frequency signals to a sequence of digitized intermediate frequency signal sample sets;
converting the sequence of digitized intermediate frequency signal sample sets to a sequence of frequency domain sample sets, each frequency domain sample set comprising a frequency value and signal energy value;
dividing a frequency span into a plurality of frequency sample bins;
associating, for each frequency sample bin, all frequency domain samples from the sequence of frequency domain sample sets having a frequency value within the frequency sample bin; and
selecting for a combined frequency domain sample set, for each frequency sample bin, out of the frequency domain samples associated with the frequency sample bin, the frequency domain sample having the signal energy value that is lowest.

2. A method comprising the steps of:
converting a sequence of digitized intermediate frequency signal sample sets to a sequence of frequency domain sample sets, each frequency domain sample set comprising a frequency value and signal energy value;
dividing a frequency span into a plurality of frequency sample bins;
associating, for each frequency sample bin, all frequency domain samples from the sequence of frequency domain sample sets having a frequency value within the frequency sample bin; and
selecting for a combined frequency domain sample set, for each frequency sample bin, out of the frequency domain samples associated with the frequency sample bin, the frequency domain sample having the signal energy value that is lowest.

3. The method of claim 2, further comprising the steps of:
sequentially converting, using one or more mixers, a radio frequency signal to a sequence of intermediate frequency signals using a sequence of local oscillator signals generated by a local oscillator, each of oscillator signals having a different frequency; and
sequentially converting, with an analog-to-digital converter, the sequence of intermediate frequency signals respectively to the sequence of digitized intermediate frequency signal sample sets.

4. A non-transient computer readable medium encoded with instructions that when executed by a processor cause the processor to perform the steps of:
converting a sequence of digitized intermediate frequency signal sample sets to a sequence of frequency domain sample sets, each frequency domain sample set comprising a frequency value and signal energy value;
dividing a frequency span into a plurality of frequency sample bins;
associating, for each frequency sample bin, all frequency domain samples from the sequence of frequency domain sample sets having a frequency value within the frequency sample bin; and
selecting for a combined frequency domain sample set, for each frequency sample bin, out of the frequency domain samples associated with the frequency sample bin, the frequency domain sample having the signal energy value that is lowest.

* * * * *